(12) United States Patent
Jin et al.

(10) Patent No.: US 6,627,537 B2
(45) Date of Patent: Sep. 30, 2003

(54) BIT LINE AND MANUFACTURING METHOD THEREOF

(75) Inventors: Won-Hwa Jin, Yeijungbu (KR); Keun-Su Kim, Cheongju (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 0 days.

(21) Appl. No.: 09/777,703

(22) Filed: Feb. 7, 2001

(65) Prior Publication Data

US 2001/0012695 A1 Aug. 9, 2001

(30) Foreign Application Priority Data

Feb. 8, 2000 (KR) .......................................... 2000/5761

(51) Int. Cl.$^7$ .......................................... H01L 21/4763
(52) U.S. Cl. ...................... 438/637; 438/627; 438/643; 438/644; 438/672
(58) Field of Search ................. 438/637, 644, 438/643, 627, 648, 660, 674–5, 672, 680, 685, 688, 974

(56) References Cited

U.S. PATENT DOCUMENTS 6,136,690 A * 10/2000 Li ................................ 438/627
6,334,249 B2 * 1/2002 Hsu ....................... 204/192.17

* cited by examiner

Primary Examiner—George Fourson
Assistant Examiner—Thanh V Pham
(74) Attorney, Agent, or Firm—Birch, Stewart, Kolasch & Birch, LLP

(57) ABSTRACT

A method for manufacturing a bit line is disclosed. Such a method includes: forming a layer-insulation layer on the surface of a semiconductor substrate; forming a contact hole on a predetermined region of the layer-insulation layer; forming a first conductive layer on the upper surface of the layer-insulation layer and inside the contact hole, the first conductive layer being made of a metal; forming a second conductive layer on the upper surface of the first conductive layer, the second conductive layer being made of a metal; and patterning the first and the second conductive layers together. The bit line made of a metal is manufactured to be integrated with a plug. The first conductive layer is formed by sputtering while the second conductive layer is formed by chemical vapor deposition, thereby shortening the process and improving the characteristics of the bit line.

17 Claims, 4 Drawing Sheets

BIT LINE AND MANUFACTURING METHOD THEREOF

BACKGROUND OF THE INVENTION

1. Field of the Invention

The present invention relates to a semiconductor device, and more particularly, to a bit line of a semiconductor device and its manufacturing method.

2. Description of the Background Art

As the density of integrated devices is increased, elements of the integrated devices become smaller. Accordingly, a bit line, one of the elements of the integrated device, is reduced in its cross-sectional area. This causes the resistance of the bit line to increase. To solve the problem, it is known to form the bit line of a metal. Tungsten is typically used as the metal wiring material.

FIGS. 1A through 1G show a sequential method for manufacturing a bit line using tungsten according to the background art.

First, as shown in FIG. 1A, on a semiconductor substrate 1 where a device isolation, a well formation and a planarization was performed, a layer-insulation layer 3 is deposited. Then a photo-etching process is performed by using a photoresist (not shown) as a mask to form a contact hole 5 in a predetermined region of the layer-insulation layer 3.

Then, as shown in FIG. 1B, cleaning is performed in order to remove a foreign substance such as a native oxide (not shown) existing at the bottom surface of the contact hole 5. And then, a diffusion barrier 7 formed of a multi-film of Ti/TiN is formed on the upper portion of the layer-insulation layer 3 and on the inner side of the contact hole 5.

Thereafter, thermal treatment is performed to form a silicide layer 9 in the vicinity of the interface of the semiconductor substrate 1 and the diffusion barrier 7. The silicide layer 9 serves to reduce a contact resistance between the semiconductor substrate 1 and the bit line. After formation of the silicide layer 9 through the thermal treatment, a titanium nitride is additionally deposited on the upper surface of the diffusion barrier 7.

And then, as shown in FIG. 1C, a first tungsten layer 11 is thickly formed on the diffusion barrier 7 and inside the contact hole 5 by a chemical vapor deposition (CVD) method. The first tungsten layer 11 completely fills the contact hole 5.

Next, as shown in FIG. 1D, the first tungsten layer 11 is removed by etching back or by chemical mechanical polishing (CMP) so that the upper surface of the diffusion barrier 7 is exposed, to thereby form a tungsten plug 11'.

Then, as shown in FIG. 1E, a titanium nitride layer 13 is formed on the upper surface of the tungsten plug 11' and of the diffusion barrier 7.

And then, as shown in FIG. 1F, a second tungsten layer 15 is formed on the upper surface of the titanium nitride layer 13 for a line. The second tungsten layer 15 is deposited by the chemical vapor deposition method, for which $SiH_4$ is used as a deoxidation gas in the initial stage of the deposition and $H_2$ is used as a deoxidation gas in the later stage of the deposition.

The tungsten layer deposited by using $SiH_4$ as a deoxidation gas is disadvantageous in that its resistivity is high and a step coverage is bad. Meanwhile, in case of the tungsten layer deposited by using $H_2$ as a deoxidation gas, its resistivity is low and a step coverage is satisfactory. But, in case of the tungsten layer deposited by using the tungsten layer using $H_2$ as a deoxidation gas, since it is not evenly deposited on the titanium nitride layer, a tungsten layer is deposited with the thickness of 200 Å~500 Å in the initial stage of deposition of the second tungsten layer by using $SiH_4$ as deoxidation gas.

Subsequently, a photoresist film is coated on the upper surface of the second tungsten layer 15 and patterned to form a photoresist film pattern 17.

Next, as shown in FIG. 1G, the second tungsten layer 15, the titanium nitride layer 13 and the diffusion barrier 7 are sequentially etched by photo-etching process using the photoresist film pattern 17 as a mask, so as to form a bit line 20. The bit line 20 is part of a bit conductor structure 22 that also includes the tungsten plug 11 and the titanium nitride layer 13. The diffusion barrier 7 positioned at the corner portion of the contact hole 5 is a bit excessively etched during the photo-etching process.

Finally, the photoresist film pattern 17 which was used as a mask is removed, thereby completing the manufacturing process of bit line in accordance with the conventional art.

The method for manufacturing the bit line in accordance with the background art has problems in that since the plug and the line are separately formed, the manufacturing process is complicated and the unit cost of the device is increased. Also, since particles are increasingly generated during the process, the yield rate is lowered.

In addition, according to the method for manufacturing the bit line in accordance with the background art, the tungsten layer 15 for forming the line is formed on the titanium nitride. Therefore, when the tungsten layer 15 is deposited by the chemical vapor deposition method, $SiH_4$ is used as a dioxidation gas at the initial stage of the deposition and $H_2$ is used as a dioxidation gas at the later stage of the deposition, the manufacturing process is complicated. Also, the tungsten layer deposited by using $SiH_4$ as a dioxidation gas has a high resistivity and undesirable step coverage, degrading the characteristics of the bit line.

Moreover, in the method for manufacturing the bit line in accordance with the background art, the tungsten layer 15 is deposited by the chemical vapor deposition method which uses $WF_6$ as a source gas. In this respect, there is a high possibility that fluorine (F) of the source gas etches the silicon forming the semiconductor substrate and $SiF_1$ is thereby formed, leading to an increase in the contact resistance of the bit line and the leakage current.

SUMMARY OF THE INVENTION

Therefore, an object of the present invention is to provide a bit line and its manufacturing method which are capable of simplifying the manufacturing process of the bit line, and of improving yield by reducing the amount of particles generated during its process, thereby lowering unit cost.

Another object of the present invention is to provide a bit line and its manufacturing method which are capable of improving electric characteristics of a bit line by reducing the amount of a diffusion barrier that is formed in the bit line, the diffusion barrier layer having a higher resistivity than tungsten.

Still another object of the present invention is to provide a bit line and its manufacturing method which are capable of removing the necessity to deposit a tungsten layer on a titanium nitride layer by chemical vapor deposition, so that there is no need to use $SiH_4$ as a dioxidation gas, and thus, characteristics of the tungsten layer can be highly improved.

Yet another object of the present invention is to provide a bit line and its manufacturing method which are capable of resolving the problem that WF6 (when used as a source gas for a tungsten layer deposited by chemical vapor deposition) etches silicon or reacts with the silicon to degrade the characteristics of the bit line.

To achieve these and other advantages and in accordance with the purposed of the present invention, as embodied and broadly described herein, there is provided a bit line including: substrate including semiconductor material; a layer-insulation layer formed on the upper surface of the substrate with a contact hole therein; a metal layer reacting with the substrate exposed by the contact hole; a silicide formed where the metal layer contacts the substrate; a nitride layer formed on the upper surface of the metal layer; a first conductive layer (having attributes that are characteristic of being formed by a first deposition technique) formed on the upper surface of the nitride layer, the first conductive layer being made of a metal; and a second conductive layer (having attributes that are characteristic of being formed by a second deposition technique) formed on the upper surface of the first conductive layer, the second conductive layer being made of a metal.

In order to achieve the above objects, there is provided a method for manufacturing a bit line, the method including: forming a layer-insulation layer on the surface of a substrate that includes semiconductor material; forming a contact hole on a predetermined region of the layer-insulation layer; forming a diffusion barrier inside the contact hole; forming a first conductive layer on the upper surface of the diffusion barrier; forming a second conductive layer on the upper surface of the first conductive layer; wherein the first and second conductive layers are formed by different deposition techniques; and patterning the first and the second conductive layers.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

FIGS. 2A through 2E show sequential process of a method for manufacturing a bit line using tungsten in accordance with the present invention.

Figure 1A:
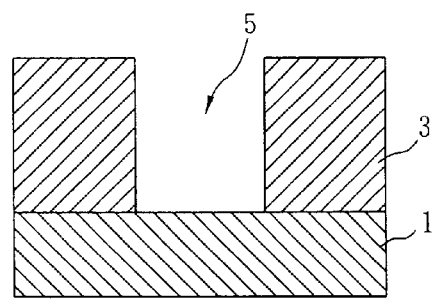
FIGS. 1A through 1G show sequential process of a method for manufacturing a bit line using tungsten in accordance with the background art.
Figure 1B:
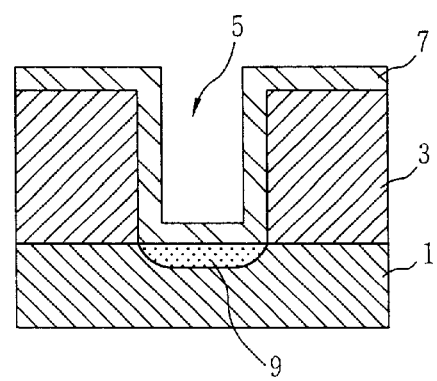
Figure 1C:
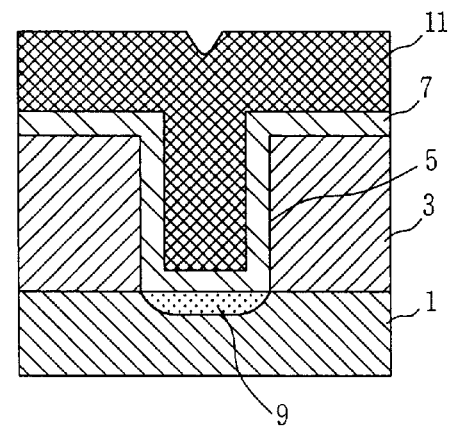
Figure 1D:
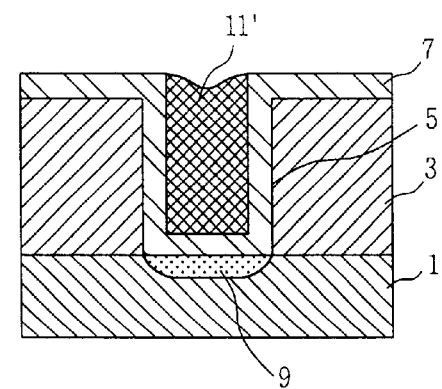
Figure 1E:
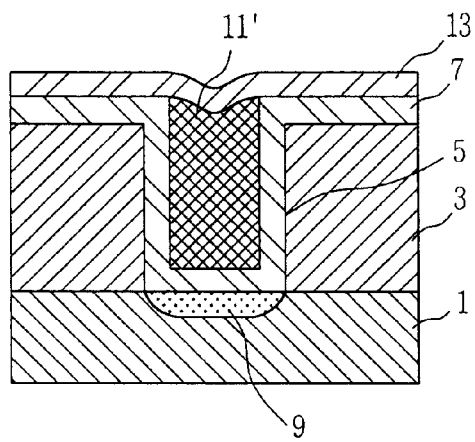
Figure 1F:
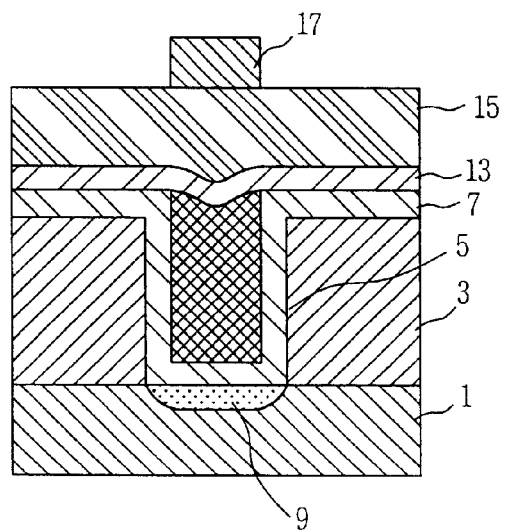
Figure 1G:
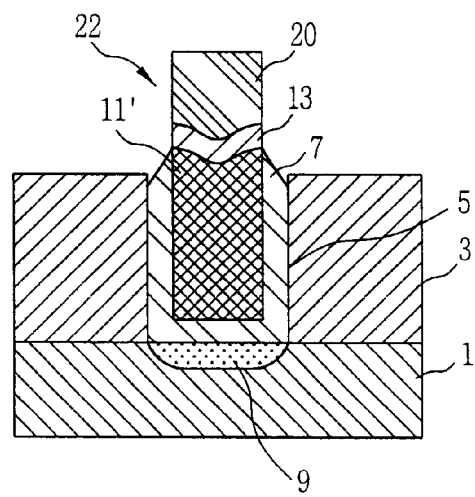
Figure 2A:
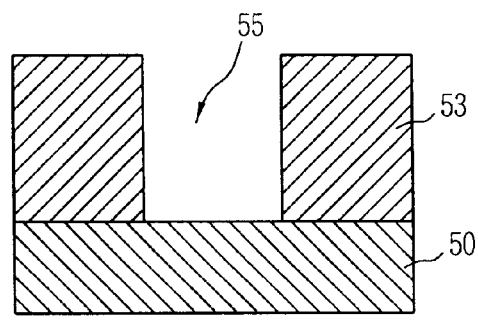
FIGS. 2A through 2E show sequential process of a method for manufacturing a bit line using tungsten in accordance with the present invention.

First, as shown in FIG. 2A, after performing device isolation, well formation, word line formation and planarization for a semiconductor substrate 50, a layer-insulation layer 53 is deposited on the upper surface of the semiconductor substrate 50. And then, a contact hole 55 is formed on a predetermined region of the layer-insulation layer 53 by using a photo-etching process that uses a photoresist film (not shown) as a mask.

The layer-insulation layer 53 is typically made of a silicon oxide, for which high temperature low pressure (HLD), boron phosphorous silicate glass (BPSG), or tetraethyl orthosilicate (TEOS) can be used. The contact hole 55 is typically formed by dry etching, for which, in the present invention, a reactive ion etching (RIE) can be used.

Figure 2B:
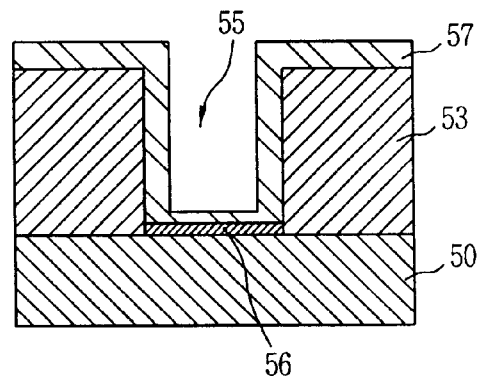

Next, as shown in FIG. 2B, cleaning is performed in order to remove a foreign substance such as a native oxide (not shown) existing on the bottom surface of the contact hole 55. Referring to the cleaning, in the present invention, a wet cleaning method can be used, and as a cleaning liquid, a buffered oxide etchant (BOE) or a liquid of a BOE mixed with a detergent can be used.

Subsequently, a diffusion barrier 57 is formed on the upper surface of the layer-insulation layer 53 and inside the contact hole 55. The diffusion barrier 57 can be made of a multi-film of a metal layer and a nitride layer. In the present invention, titanium can be used for the metal layer, which can be formed by sputtering or the chemical vapor deposition.

The metal layer can be about 50 Å~400 Å in thickness. The nitride layer serves to restrain reaction between the metal layer and a first conductive layer (to be described) from occurring. In the present invention, titanium nitride can be used for the nitride layer, which can be formed by sputtering or chemical vapor deposition.

Thereafter, a thermal treatment is performed to form a suicide layer 56 in the vicinity of the interface of the semiconductor substrate 50 and the diffusion barrier 57. In the present invention, the silicide layer 56 can be made of titanium suicide, which serves to reduce a contact resistance between the semiconductor substrate 50 and the bit line. And, the thermal treatment can be performed for 10 seconds~60 seconds at a temperature of more than about 500° C. in an atmosphere of, e.g., $N_2$ or $NH_2$, by using a furnace or a rapid thermal process (RTP).

Figure 2C:
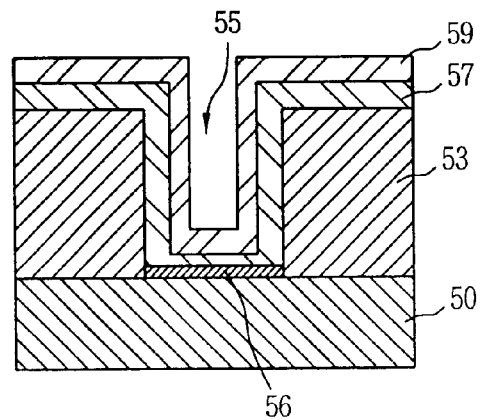

Next, as shown in FIG. 2C, the first conductive layer 59 can be deposited on the upper surface of the diffusion barrier 59 and inside the contact hole 55 by the sputtering method. The first conductive layer 59 can be made of a metal, which is preferably made of tungsten in the present invention.

The first conductive layer 59 serves as a glue layer for supplementing the insufficient adhesive force between a forthcoming second conductive layer and the layer-insulation layer 33 when the second conductive layer is deposited by chemical vapor deposition. The second conductive layer also serves as a barrier for preventing gas such as $WF_6$ or HF, which is used or generated in the following process, from diffusing toward the semiconductor substrate 50.

Also, if the first conductive layer 59 is deposited by sputtering, unlike the case where it is deposited by chemical vapor deposition, there are no problems such as the gas within the chamber etching the semiconductor substrate or reacting with the semiconductor substrate, resulting in a reduction of the contact resistance of the bit line and an increase in the leakage current. The thickness of the first conductive layer is varied depending on the depth of the contact hole 55, which, in the present invention, can be in the range of about 200 Å~500 Å.

Figure 2D:
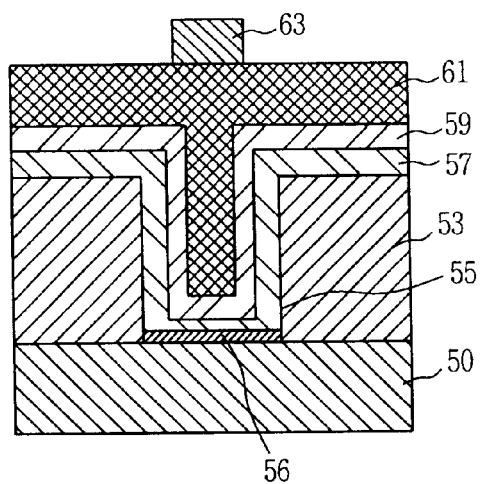

And, as shown in FIG. 2D, the second conductive layer 61 is formed on the upper surface of the first conductive layer 59 and inside the contact hole 55 by chemical vapor deposition. In the present invention, deposition temperature of the second conductive layer 61 can be in the range of about 250° C.~600° C. The second conductive layer 61 is made of a metal, which in the present invention, can be tungsten.

Since the second conductive layer 61 is evenly deposited on the first conductive layer 59 that is made of a metal, there is no need to use $SiH_4$ gas as a deoxidation gas (as in the background art, which degrades the characteristics of the tungsten layer). Accordingly, as compared to that of the background art, the resistivity of the tungsten layer can be reduced and step coverage can be improved. Subsequently, the photoresist film layer is deposited on the upper surface of the second conductive layer 61 and patterned, to form the photoresist film pattern 63.

Figure 2E:
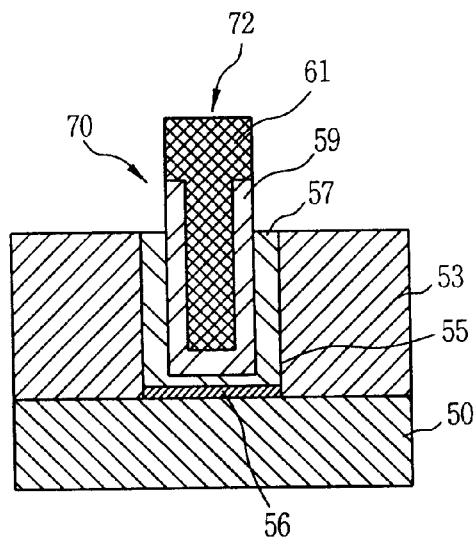

And then, as shown in FIG. 2E, the second conductive layer 61, the first conductive layer 59 and the diffusion barrier 57 are sequentially etched by the photo-etching process which uses the photoresist film pattern 63 as a mask, to form the bit line 70. The bit line 70 is a part of a bit conductor structure 72 that also includes the first conductive layer 59.

In the present invention, in order to etch the first and the second conductive layers 59 and 61, $SF_6$ and $Cl_2$ can be used as etching gases, while, for the diffusion barrier 57, $BCl_2$ and $Cl_2$ can be used as etching gases.

Finally, the photoresist film pattern 63 used as a mask is removed, thereby completing the process of manufacturing the bit line according to the present invention.

According to the present invention, since the thickness of the first conductive layer rather than thickness of the second conductive layer (from which is formed the bit line), is reduced, the resistivity of the bit line can be reduced. Compared to the bit line manufactured according to the background art that has a resistivity of more than 10.5 $\mu\Omega$-cm, the bit line according to the present invention can exhibit a resistivity of approximately 8.5 $\mu\Omega$-cm, so that at least about 20% of the resistivity is reduced.

Accordingly, in case of manufacturing a bit line having the same resistance, the height of the bit conductor structure can be decreased by at least about 30%~40%, facilitating the planarization process and improving the RC time delay effect.

In addition, according to the present invention, formation of the titanium nitride layer between the plug and the bit line is omitted, having an effect that the height of the overall bit conductor structure is reduced.

Moreover, when the bit line is formed by chemical vapor deposition, $SiH_4$ is not used as a deoxidation gas, so that the step coverage of the bit line can be improved and the resistivity can be reduced.

Also, the first conductive layer is formed by sputtering, resolving the problem in the background art that WF6 used as a source gas for the chemical vapor deposition method etches the silicon or reacts on the silicon to degrade the characteristics of the bit line.

Furthermore, shortening of the process steps reduces manufacturing costs, and decreasing of the amount of the particles generated during the process improves production yield.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the meets and bounds of the claims, or equivalence of such meets and bounds are therefore intended to be embraced by the appended claims.

What is claimed is:

1. A method for manufacturing a bit line, the method comprising:

forming a layer-insulation layer on the surface of a substrate that includes semiconductor material;

forming a contact hole on a predetermined region of the layer-insulation layer;

forming a first conductive layer on the upper surface of the layer-insulation layer and inside the contact hole;

forming a second conductive layer on the upper surface of the first conductive layer and inside the contact hole;

wherein the first conductive layer and second conductive layer are formed by different deposition techniques; and patterning the first and the second conductive layers togather, thereby removing the first and the second conductive layers entirely from an upper surface of the layer insulation layer to form the bit line in the contact hole.

2. The method according to claim 1, wherein the first and the second conductive layers are made of first and second metals, respectively.

3. The method according to claim 1, wherein the first conductive layer is deposited by sputtering.

4. The method according to claim 1, wherein the second conductive layer is deposited by chemical vapor deposition.

5. The method according to claim 4, wherein the second conductive layer is deposited by using $H_2$ as a sole deoxidation gas.

6. The method according to claim 1, wherein the first and the second conductive layers are made of tungsten.

7. The method according to claim 1, wherein the first conductive layer has the thickness in the range of about 200 Å~500 Å.

8. The method according to claim 1, further comprising forming a metal layer that is able to react on the semiconductor substrate so as to form a silicide, prior to the step of forming the first conductive layer.

9. The method according to claim 8, wherein the metal layer is made of titanium.

10. The method according to claim 9, wherein the metal layer is deposited by sputtering or by chemical vapor deposition.

11. The method according to claim 8, wherein the metal layer has the thickness in the range of about 50 Å~400 Å.

12. The method according to claim 8, further comprising forming a barrier layer on the metal layer, wherein the first conductive layer is formed on the barrier layer, the barrier layer restraining the mutual reaction of the metal layer with the first conductive layer therebetween.

13. The method according to claim 12, wherein the barrier layer is titanium nitride.

14. The method according to claim 13, wherein the barrier layer is deposited by sputtering or chemical vapor deposition.

15. The method according to claim 12, further comprising performing a thermal treatment so that the metal layer and the semiconductor substrate react with each other to thereby form a silicide layer, prior to forming the first conductive layer.

16. The method according to claim 15, wherein the thermal treatment is performed in the atmosphere of $N_2$ or $NH_3$.

17. The method according to claim 15, wherein the thermal treatment is performed for about 10 seconds~60 seconds.

* * * * *